(12) United States Patent
Ouchi

(10) Patent No.: US 10,937,660 B2
(45) Date of Patent: Mar. 2, 2021

(54) METHOD FOR PROCESSING WORKPIECE

(71) Applicant: TOKYO ELECTRON LIMITED, Tokyo (JP)

(72) Inventor: Kenji Ouchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 75 days.

(21) Appl. No.: 16/310,459

(22) PCT Filed: Jun. 15, 2017

(86) PCT No.: PCT/JP2017/022155
§ 371 (c)(1),
(2) Date: Dec. 17, 2018

(87) PCT Pub. No.: WO2017/221807
PCT Pub. Date: Dec. 28, 2017

(65) Prior Publication Data
US 2019/0326124 A1 Oct. 24, 2019

(30) Foreign Application Priority Data
Jun. 20, 2016 (JP) .............................. JP2016-121820

(51) Int. Cl.
*H01L 21/311* (2006.01)
*C23C 16/24* (2006.01)
(Continued)

(52) U.S. Cl.
CPC ........ *H01L 21/31116* (2013.01); *C23C 16/24* (2013.01); *C23C 16/50* (2013.01);
(Continued)

(58) Field of Classification Search
None
See application file for complete search history.

(56) References Cited

U.S. PATENT DOCUMENTS 5,596,431 A * 1/1997 Bongaerts ........... G02F 1/13334
349/32
6,107,192 A * 8/2000 Subrahmanyan ..... C23C 14/022
438/637
(Continued)

FOREIGN PATENT DOCUMENTS

JP   H2-9126 A      1/1990
JP   H7-226437 A    8/1995
JP   2002-359241 A  12/2002

OTHER PUBLICATIONS

International Search Report issued in PCT/JP2017/022155; dated Jul. 18, 2017.
(Continued)

*Primary Examiner* — Allan W. Olsen
(74) *Attorney, Agent, or Firm* — Studebaker & Brackett PC

(57) ABSTRACT

In one embodiment that provides a technology in which process complication is suppressed and selective pattern film formation is performed, a method MT for processing a wafer W is provided, the wafer W includes a metal portion 61, an insulating portion 62, and a main surface 6, and a surface 61*a* of the metal portion 61 and a surface 62*a* of the insulating portion 62 are exposed on the main surface 6 side, the method MT includes: a step S1 of accommodating the wafer W in a processing chamber 4 of a plasma processing apparatus 10; a step S2 of starting supplying O2 gas into the processing chamber 4; and a step S3 of generating a plasma in the processing chamber 4 by the gas in the processing chamber 4 containing a SiF4 gas by supplying the SiF4 gas and plasma generation high-frequency power into the processing chamber 4, the plasma generated in the step S3 contains deposition species and etching species, and, in the plasma generated in the step S3, a proportion occupied by
(Continued)

the etching species is greater than a proportion occupied by the deposition species.

18 Claims, 7 Drawing Sheets

(51) Int. Cl.
    *C23C 16/50*         (2006.01)
    *C23C 16/52*         (2006.01)
    *C23F 4/00*          (2006.01)
    *H01J 37/32*         (2006.01)
    *H01L 21/02*         (2006.01)
    *H01L 21/67*         (2006.01)
    *H01L 21/683*        (2006.01)

(52) U.S. Cl.
    CPC ................ *C23C 16/52* (2013.01); *C23F 4/00* (2013.01); *H01J 37/3211* (2013.01); *H01J 37/3244* (2013.01); *H01J 37/32495* (2013.01); *H01L 21/02131* (2013.01); *H01L 21/02274* (2013.01); *H01L 21/67069* (2013.01); *H01J 37/32724* (2013.01); *H01J 2237/3321* (2013.01); *H01J 2237/3341* (2013.01); *H01L 21/6833* (2013.01)

(56) References Cited

U.S. PATENT DOCUMENTS

| | | | | |
|---|---|---|---|---|
| 7,250,373 | B2* | 7/2007 | Mui | H01L 21/32137 257/E21.312 |
| 7,585,759 | B2* | 9/2009 | Kuechenmeister | H01L 24/11 216/13 |
| 2006/0172444 | A1* | 8/2006 | Jungnickel | H01L 22/14 438/14 |
| 2007/0293043 | A1* | 12/2007 | Singh | H01J 37/321 438/689 |
| 2009/0184089 | A1* | 7/2009 | Chebi | H01J 37/3244 216/13 |
| 2009/0275162 | A1* | 11/2009 | Papageorgiou | B81C 1/00246 438/50 |
| 2011/0207323 | A1* | 8/2011 | Ditizio | B81C 1/00087 438/675 |
| 2013/0216177 | A1* | 8/2013 | Tseng | G02B 6/132 385/14 |
| 2014/0187035 | A1* | 7/2014 | Posseme | H01L 21/02063 438/618 |
| 2014/0213060 | A1* | 7/2014 | Kao | H01L 21/31144 438/703 |
| 2016/0268164 | A1* | 9/2016 | Matsui | H01L 21/467 |

OTHER PUBLICATIONS

Fatemeh Sadat Minaye Hashemi et al., "A New Resist for Area Selective Atomic and Molecular Layer Deposition on Metal-Dielectric Patterns", The Journal of Physical Chemistry C, ACS Publications, vol. 118, No. 20, May 2, 2014, pp. 10957-10962.

\* cited by examiner (a)

(b)

METHOD FOR PROCESSING WORKPIECE

TECHNICAL FIELD

An embodiment of the present invention relates to a method for processing a workpiece.

BACKGROUND ART

In accordance with miniaturization of semiconductors, a wiring pattern has become highly detailed, and accordingly, high precision patterning technology is required. However, in a film formation process, such as CVD or ALD, it is considered that a state (material) of a surface on which pattern film formation is performed influences the nucleation time (incubation time), and accordingly, it is considered that the state is one of important process factors. Technological development in which a difference in nucleation time that corresponds to the state (material) of the surface is employed in selective pattern film formation is pursued, but an influence of the difference in state (material) of the surface on nucleation time is relatively small, and thus, the technological development is accompanied by difficulties. In Non-Patent Document 1, a technology in which, by selectively attaching self-assembled monolayer (SAM) to the surface on which the pattern film formation is performed and by increasing the difference in state of the surface (for example, hydrophilicity or hydrophobicity), the difference in nucleation time increases in accordance with the difference in state of the surface, have been reported.

CITATION LIST

Non Patent Document

[Non-Patent Document 1] Fatemeh Sadat, Minaye Hashemi, Chaiya Prasittichai, Stacey F. Bent, "A New Resist for Area Selective Atomic and Molecular Layer Deposition on Metal-Dielectric Patterns", THE JOURNAL OF PHYSICAL CHEMISTRY C, American Chemical Society, May 2, 2014, 118(20), pp10957-10962

SUMMARY OF INVENTION

Technical Problem

However, according to the technology reported in Non-Patent Document 1, a process of attaching SAM or the like is required before the pattern film formation, and the process of pattern film formation can be complicated. Therefore, it is desired to realize a technology capable of performing selective pattern film formation while suppressing process complication.

Solution to Problem

According to an aspect, there is provided a method for processing a workpiece. The workpiece includes a metal portion, an insulating portion, and a main surface, and a first surface of the metal portion and a second surface of the insulating portion are exposed on the main surface side. The method includes: (a) a first step of accommodating an workpiece in a processing chamber of a plasma processing apparatus; (b) a second step of starting supplying a first gas into the processing chamber after the first step; and (c) a third step of starting processing of generating a plasma in the processing chamber caused by a gas in the processing chamber containing a second gas by supplying the second gas and plasma generation high-frequency power into the processing chamber after the second step. The first gas contains oxygen. The plasma generated in the third step contains deposition species and etching species. In the plasma generated in the third step, the proportion occupied by the etching species is greater than the proportion occupied by the deposition species.

In an embodiment, an element of the deposition species may be silicon and an element of the etching species may be halogen.

In the embodiment, an element of the etching species may be fluorine.

In the embodiment, the second gas may contain silicon and halogen.

In the embodiment, the metal portion may contain copper.

In the embodiment, in the third step, supplying of the second gas into the processing chamber and supplying of the plasma generation high-frequency power into the processing chamber may be performed at the same timing.

In the embodiment, the method further includes a fourth step of terminating generation of the plasma after the third step. In the fourth step, supplying of the first gas into the processing chamber and the supplying of the second gas into the processing chamber are terminated at the same timing, after terminating the supplying of the plasma generation high-frequency power into the processing chamber.

In the embodiment, in the first step, the surface on an inner side of the processing chamber may have a part covered with a precoat film that contains silicon and halogen.

In the embodiment, in the third step, the temperature of the workpiece may be within the range of 50 degrees Celsius to 450 degrees Celsius. As a result of earnest research, the inventors have found that, in a case where the temperature of the workpiece is within the range of 50 degrees Celsius to 450 degrees Celsius in the third step, the lamination of the film to the first surface of the metal portion is suppressed, and lamination of the film to the second surface of the insulating portion is promoted.

Advantageous Effects of Invention

According to the above-described aspect, a technology in which selective pattern film formation is performed while suppressing process complication is provided.

DESCRIPTION OF EMBODIMENTS

Figure 1:
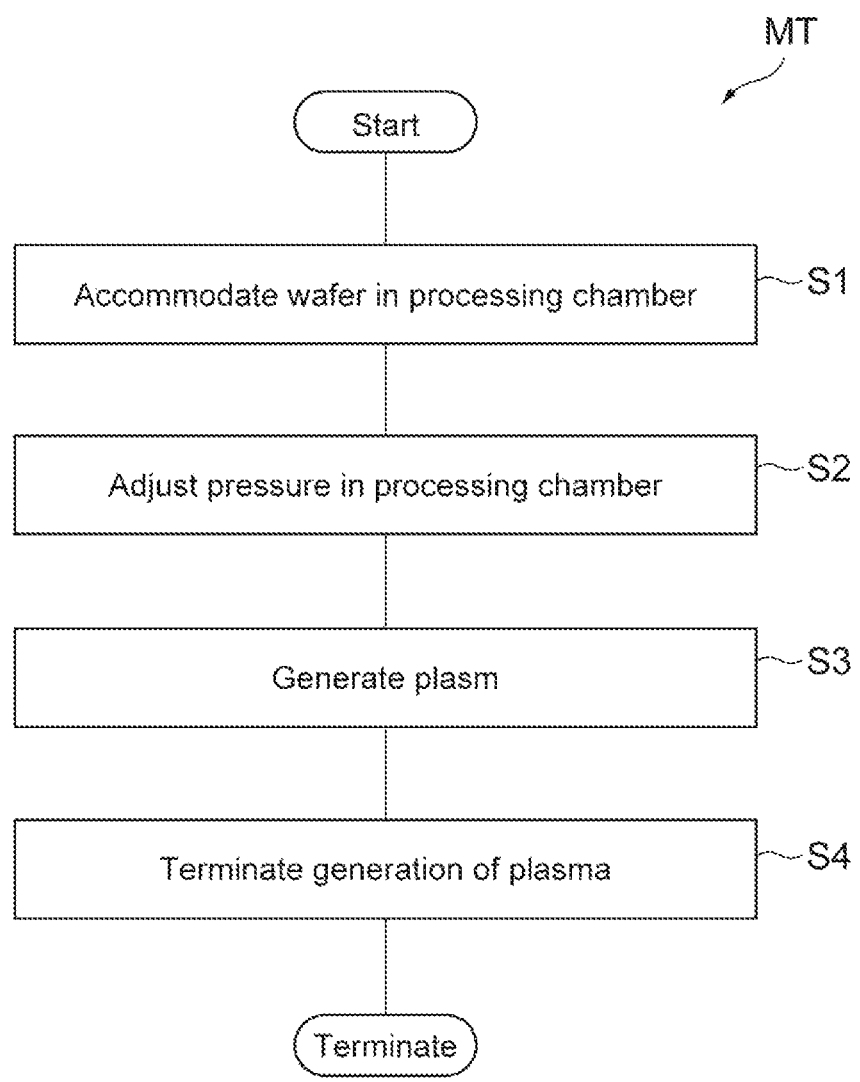
FIG. 1 is a flowchart illustrating a method according to an embodiment.

Hereinafter, various embodiments will be described in detail with reference to the accompanying drawings. In addition, the same or equivalent parts in the drawings are denoted by the same reference numerals. FIG. 1 is a flowchart illustrating a method of an embodiment. A method MT of the embodiment illustrated in FIG. 1 is a method of processing a workpiece (hereinafter, may be referred to as "wafer" in some cases). In addition, in the method MT of the embodiment, it is possible to execute a series of steps using a single plasma processing apparatus.

Figure 2:
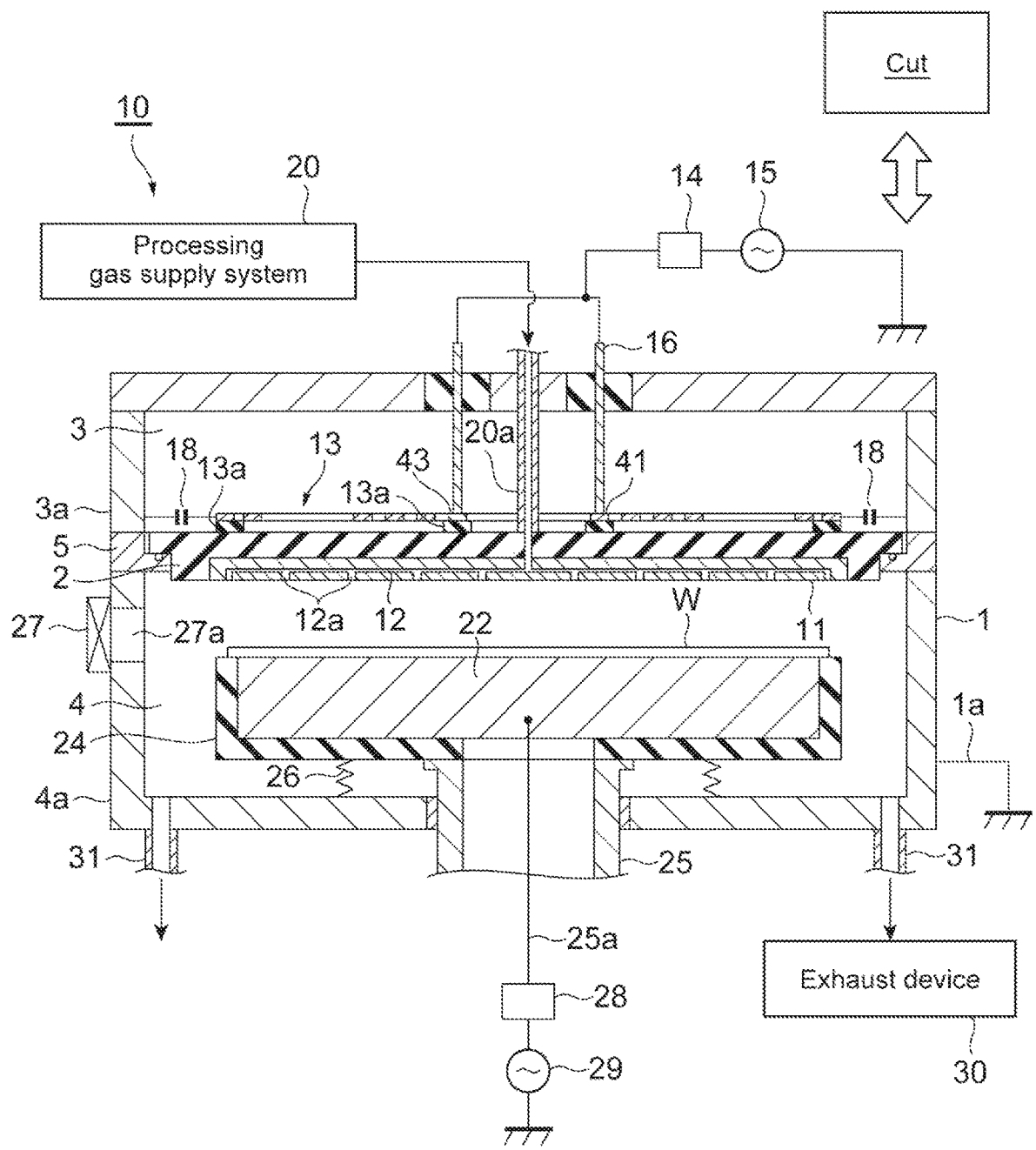
FIG. 2 is a sectional view illustrating an example of a plasma processing apparatus which implements the method illustrated in FIG. 1.

FIG. 2 is a view illustrating an example of the plasma processing apparatus. FIG. 2 schematically illustrates a sectional structure of a plasma processing apparatus 10 that can be used in various embodiments of the method for processing a workpiece. As illustrated in FIG. 2, the plasma processing apparatus 10 is an inductively coupled plasma etching apparatus.

The plasma processing apparatus 10 includes a processing container 1. The processing container 1 is airtightly provided. The processing container 1 includes a conductive material, and for example, an inner wall surface of the processing container 1 may include a material, such as anodized aluminum. The processing container 1 is assembled in a disassemblable manner and is grounded by a ground wire 1a. The processing container 1 is partitioned into an antenna chamber 3 and a processing chamber 4 vertically by a dielectric wall 2. The dielectric wall 2 configures a ceiling wall of the processing chamber 4. The dielectric wall 2 is configured of ceramics, such as $Al_2O_3$, or quartz.

A shower housing 11 for supplying processing gas is fitted into a lower part of the dielectric wall 2. The shower housing 11 is provided in a cross shape and supports the dielectric wall 2 from below. The shower housing 11 which supports the dielectric wall 2 is suspended from the ceiling of the processing container 1 by a plurality of suspenders (not illustrated).

The shower housing 11 can include a conductive material, such as a metal. The inner surface of the shower housing 11 can contain, for example, anodized aluminum, so as not to generate contaminants. A gas flow path 12 that extends along the dielectric wall 2 is formed in the shower housing 11, and a plurality of gas supply holes 12a that extend toward a susceptor 22 communicate with the gas flow path 12. At the center of the upper surface of the dielectric wall 2, a gas supply pipe 20a is provided so as to communicate with the gas flow path 12. The gas supply pipe 20a extends from the dielectric wall 2 to the outside of the processing container 1 and is connected to a processing gas supply system 20 including a processing gas supply source, a valve system and the like. In the plasma processing, the processing gas supplied from the processing gas supply system 20 is supplied into the shower housing 11 via the gas supply pipe 20a, and is discharged from the gas supply hole 12a of the lower surface (the surface facing the processing chamber 4) of the shower housing 11 to the inside of the processing chamber 4.

A supporting shelf 5 which protrudes inward is provided between a side wall 3a of the antenna chamber 3 and a side wall 4a of the processing chamber 4 in the processing container 1, and the dielectric wall 2 is placed on the supporting shelf 5.

In the antenna chamber 3, a high-frequency antenna 13 is disposed so as to face the dielectric wall 2 on the dielectric wall 2. The high-frequency antenna 13 is separated from the dielectric wall 2, for example, by a spacer 13a configured of an insulating member in a range of, for example, 50 [mm] or less. Four power supply members 16 that extend in a direction (in the vertical direction) perpendicular to the upper surface of the dielectric wall 2 are provided in the vicinity of the central portion of the antenna chamber 3, and a high-frequency power source 15 is connected to the four power supply members 16 via a matching unit 14. The power supply member 16 is disposed around the gas supply pipe 20a.

During plasma processing, plasma generation high-frequency power having a frequency of, for example, approximately 13.56 [MHz] for induction electric field formation is supplied from the high-frequency power source 15 into the processing chamber 4 via the high-frequency antenna 13. In this manner, by supplying the plasma generation high-frequency power from the high-frequency power source 15 into the processing chamber 4, an induction electric field is formed in the processing chamber 4, and the plasma of the processing gas to be supplied into the processing chamber 4 from the shower housing 11 is generated with the induction electric field. In addition, the shower housing 11 is provided in a cross shape, and supplying of the high-frequency power from the high-frequency antenna 13 into the processing chamber 4 is not disturbed even when the shower housing 11 is a metal.

The susceptor 22 (placing table) is provided below the processing chamber 4 (the side opposite the dielectric wall 2) so as to face the high-frequency antenna 13 with the dielectric wall 2 interposed therebetween. The wafer W which is as the workpiece is placed on the susceptor 22. The susceptor 22 can contain a conductive material. The surface of the susceptor 22 can contain, for example, anodized or alumina sprayed aluminum. The wafer W placed on the susceptor 22 is adsorbed and held by the susceptor 22 by an electrostatic chuck (not illustrated).

The susceptor 22 is accommodated in an insulating frame 24 and is supported by a support 25. The support 25 has a hollow structure. Between the insulating frame 24 which accommodates the susceptor 22 and the bottom portion of the processing container 1 (the side of the processing container 1 on which the support 25 is provided), a bellows 26 airtightly surrounding the support 25 is disposed. The side wall 4a of the processing chamber 4 is provided with a carrying in-out port 27a for carrying in and out the wafer W and a gate valve 27 for opening and closing the carrying in-out port 27a.

The susceptor 22 is connected to a high-frequency power source 29 via a matching unit 28 by a power supply rod 25a provided in the support 25. During the plasma processing, the high-frequency power source 29 applies bias high-frequency power, for example, bias high-frequency power having a frequency of approximately 400 [kHz] to 6 [MHz] to the susceptor 22. With the bias high-frequency power, ions in the plasma generated in the processing chamber 4 can be effectively drawn into the wafer W.

In the susceptor 22, in order to control the temperature of the wafer W, a temperature control mechanism including heating means, such as a ceramic heater, a refrigerant flow path and the like, and a temperature sensor are provided (none of these are illustrated). All of the piping or wiring for the mechanisms or members are led out of the processing container 1 through the inside of the support 25.

An exhaust device 30 including a vacuum pump and the like is connected to the bottom portion of the processing chamber 4 (the side of the processing chamber 4 on which the support 25 is provided) via an exhaust pipe 31. The processing chamber 4 is exhausted by the exhaust device 30, the inside of the processing chamber 4 is set and maintained in a predetermined vacuum atmosphere (for example, an air pressure of approximately 1.33 [Pa]) during the plasma processing.

The high-frequency antenna 13 has four power supply units (for example, a power supply unit 41, a power supply unit 43, and the like). The four power supply units are connected to the power supply member 16. The four power supply units are disposed, for example, approximately 90 degrees apart from each other around the center of the high-frequency antenna 13. Two antenna wirings extend outward from each of the four power supply units, and each of the antenna wirings is grounded via a capacitor 18.

The plasma processing apparatus 10 includes a control unit Cnt. The control unit Cnt is a computer including a processor, a storage unit, an input device, a display device and the like, and controls each unit of the plasma processing apparatus 10.

The control unit Cnt operates according to a program based on the input recipe and sends out a control signal. Based on the control signal from the control unit Cnt, it is possible to control the selection and a flow rate of the gas supplied from the processing gas supply system 20, the exhaust of the exhaust device 30, the power supply from the high-frequency power source 15 and the high-frequency power source 29, and the temperature of the susceptor 22. In addition, each step (steps S1 to S4 illustrated in FIG. 1) of the method (method MT) for processing the workpiece disclosed in the present specification can be executed by operating each unit of the plasma processing apparatus 10 under the control by the control unit Cnt.

Figure 3:
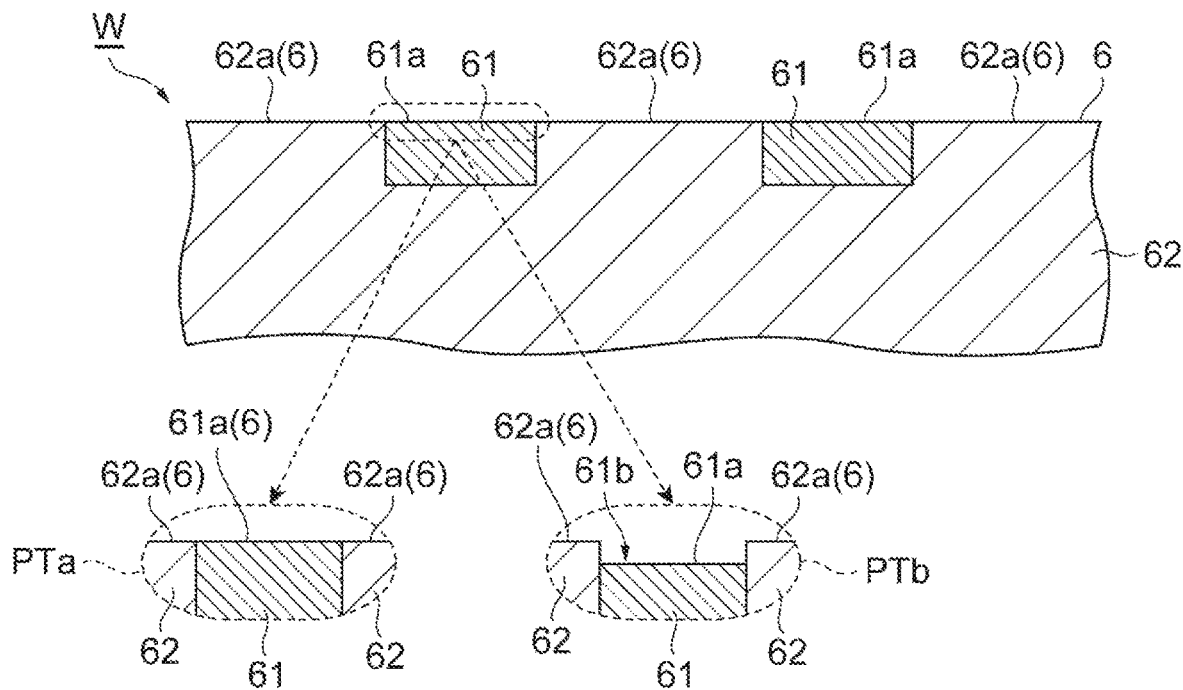
FIG. 3 includes a part (a) and a part (b), a part (a) in FIG. 3 is a sectional view schematically illustrating a state of a workpiece before execution of each step of the method illustrated in FIG. 1, and a part (b) in FIG. 3 is a sectional view schematically illustrating a state of the workpiece after the execution of each step of the method illustrated in FIG. 1.
Figure 3:
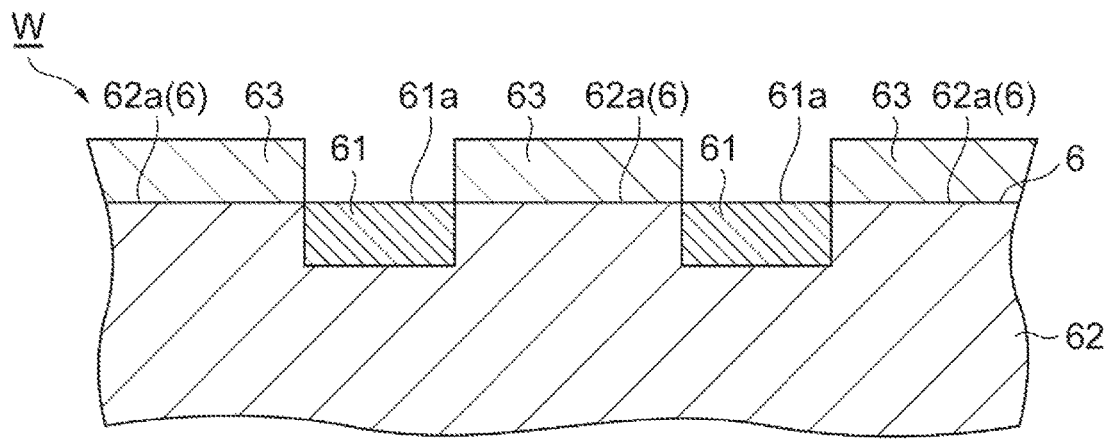
Figure 4:
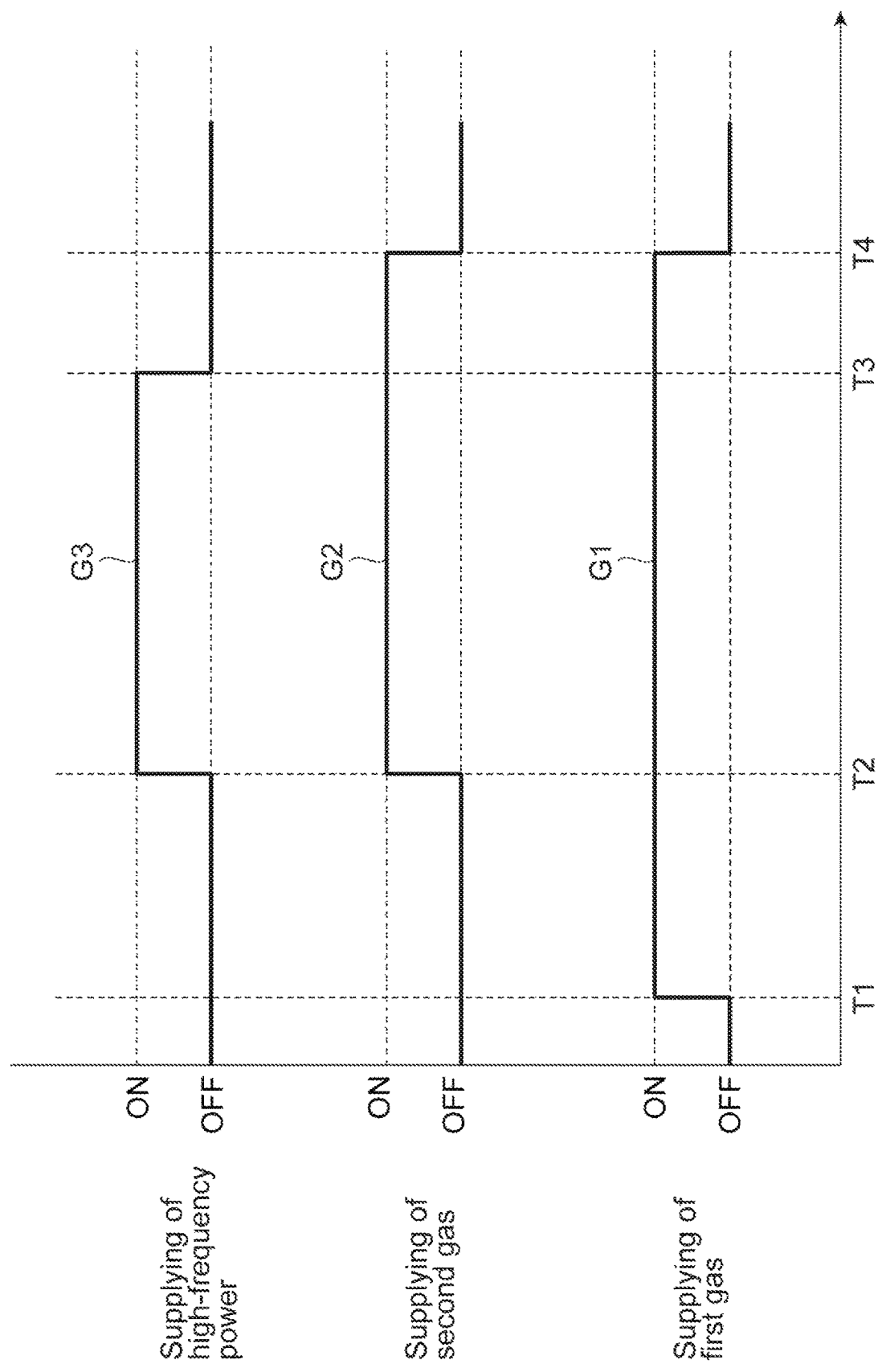
FIG. 4 is a view illustrating execution timings of various types of processing implemented in each step of the method illustrated in FIG. 1.

With reference to FIG. 1 again, the method MT will be described in detail. Hereinafter, an example in which the plasma processing apparatus 10 is used in implementation of the method MT will be described. In addition, in the following description, a part (a) of FIG. 3, a part (b) of FIG. 3, and FIG. 4 will be referred to. The part (a) of FIG. 3 is a sectional view schematically illustrating the state of the workpiece before execution of each of the steps of the method MT illustrated in FIG. 1. The part (b) of FIG. 3 is a sectional view schematically illustrating the state of the workpiece after execution of each of the steps of the method MT illustrated in FIG. 1. FIG. 4 is a view illustrating execution timings of various types of processing implemented in each of the steps of the method MT illustrated in FIG. 1.

Figure 5:
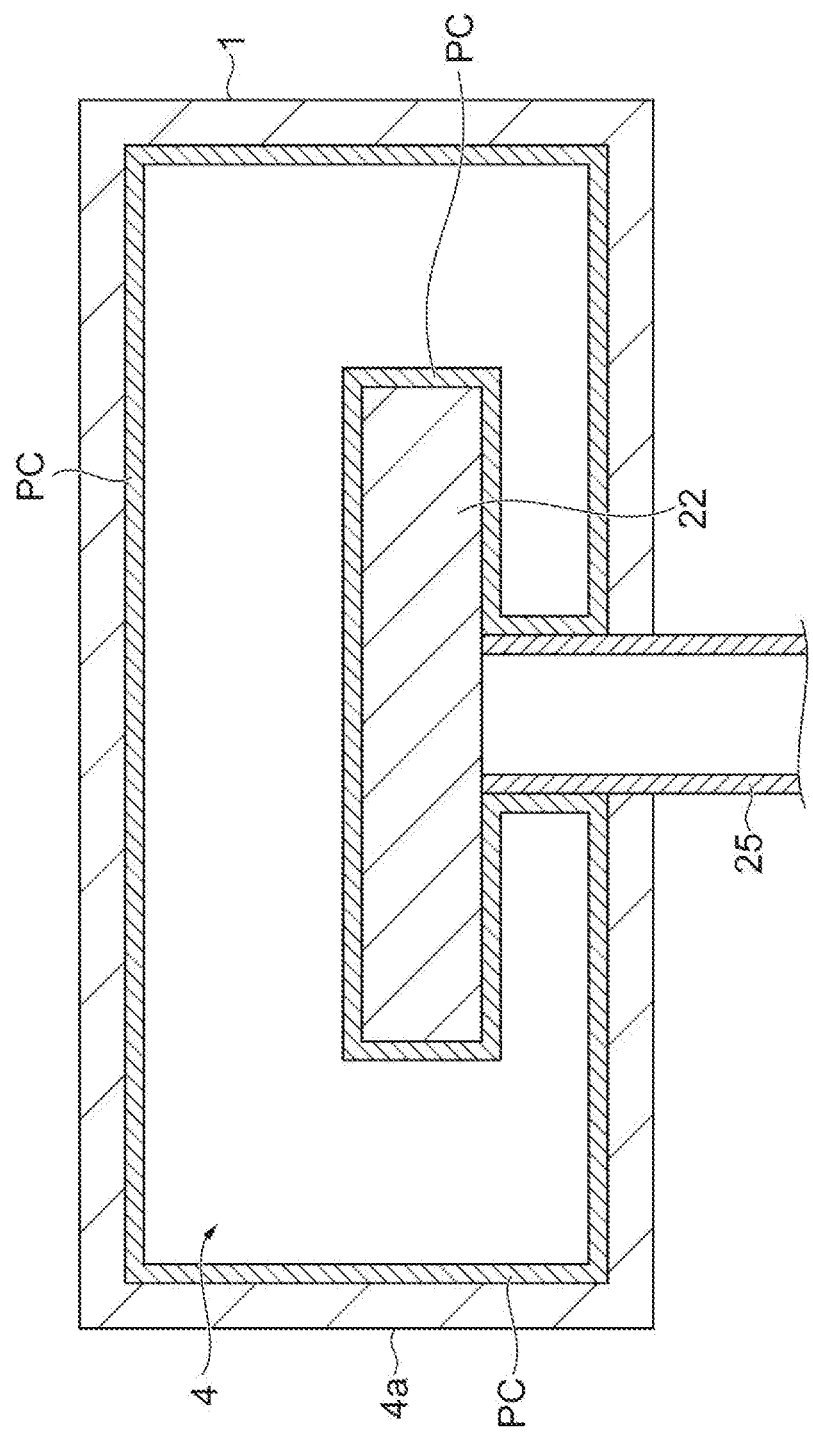
FIG. 5 is a view schematically illustrating a state where a precoat film is formed on the surface on the inner side of a processing chamber.

The method MT illustrated in FIG. 1 includes steps S1 to S4 as main steps of the method MT. In step S1 (first step), the wafer W is accommodated in the processing chamber 4 of the processing container 1 of the plasma processing apparatus 10. In addition, before the implementation of step S1, there is a case where a part of which the surface on the inner side of the processing chamber 4 used in implementing step S1 is covered with the precoat film that contains silicon and halogen can be provided. FIG. 5 is a view schematically illustrating a state where a precoat film PC is formed on the surface on the inner side of the processing chamber 4. FIG. 5 illustrates the precoat film PC formed on the entire surface on the inner side of the processing chamber 4, but the pre-coat film PC can be formed at a part of the surface on the inner side of the processing chamber 4. The precoat film PC is a film that contains silicon and halogen (for example, fluorine). In the precoat film PC, the proportion occupied by silicon can be approximately 1 time or less of the proportion occupied by halogen. The thickness of the precoat film PC is substantially uniform, but it is on average approximately 50 to 100 [nm] or more.

As illustrated in the part (a) of FIG. 3, the wafer W accommodated in the processing chamber 4 in step S1 includes a metal portion 61 and an insulating portion 62. The main surface 6 of the wafer W is formed by implementing chemical-mechanical-polishing or planarization (CMP) after the implementation of damascene, and the metal portion 61 is formed through the implementation of damascene. The metal portion 61 is buried in the insulating portion 62 on the main surface 6, and a surface 61a (first surface) of the metal portion 61 and a surface 62a (second surface) of the insulating portion 62 are exposed on the side of the main surface 6. In addition, as illustrated in an aspect PTa illustrated in the part (a) of FIG. 3, there can be a case where both the surface 61a of the metal portion 61 and the surface 62a of the insulating portion 62 are included in the main surface 6 of the wafer W, but not being limited thereto, as illustrated in an aspect PTb illustrated in the part (b) of FIG. 3, there can also be a case where only the surface 62a of the insulating portion 62 of the surface 61a, from among the metal portion 61 and the surface 62a of the insulating portion 62, is included in the main surface 6 of the wafer W, the surface 61a of the metal portion 61 is formed to extend along the main surface 6 at a position lowered from the main surface 6 toward the inner side of the wafer W, and a recess 61b of the wafer W is formed on the main surface 6.

In the metal portion 61, the material of the metal portion 61 can be, for example, copper (Cu). The material of the metal portion 61 can further be cobalt (Co), tungsten (W), aluminum (Al), rubidium (Ru), tantalum (Ta), titanium (Ti) or the like. The insulating portion 62 can be an inter level dielectric (ILD). The material of the insulating portion 62 can be a metal oxide, such as $SiO_x$, $SiN_x$, $SiC_x$, SiOC, SiOCH, and $Al_2O_3$, where x is a natural number. The material of the insulating portion 62 can be an organic material.

Following step S1, in step S2 (second step), the pressure in the processing chamber 4 is adjusted to a process pressure. Specifically, supplying of a first gas into the processing chamber 4 is started, and accordingly, the pressure in the processing chamber 4 is adjusted. As illustrated in a graph G1 of FIG. 4, in step S2, the supplying of the first gas into the processing chamber 4 is started at time T1 (the supplying of the first gas is changed from OFF to ON). The graph G1 illustrates the start timing and the end timing of the supplying of the first gas into the processing chamber 4 in the method MT. The supplying of the first gas into the processing chamber 4 is continued until time T4. Time T4 is the time after time T1. The first gas can be a gas that contains oxygen. The first gas can be an $O_2$ gas.

Following step S2, in step S3 (third step), an insulating film 63 is selectively formed only on the surface 62a of the insulating portion 62 on the main surface 6 of the wafer W by a plasma chemical vapor deposition (CVD). In step S3, processing of generating a plasma by the gas in the processing chamber 4 containing the second gas in the processing chamber 4 by supplying the second gas and the plasma generation high-frequency power into the processing chamber 4, is started.

The plasma generated in step S3 contains deposition species and etching species. In the plasma generated in step S3, the proportion occupied by the etching species is greater than the proportion occupied by the deposition species. For example, in the plasma generated in step S3, the proportion occupied by the etching species is approximately four to six times the proportion occupied by the deposition species. The second gas can be a gas that contains silicon and halogen, and in this case, in the plasma generated in step S3, an element of the deposition species is silicon and an element of the etching species is halogen. The second gas can be, for example, a gas (for example, $SiF_4$ gas) that contains silicon and fluorine, and in this case, in the plasma generated in step S3, an element of the deposition species is silicon and an element of the etching species is fluorine.

In step S3, supplying of the second gas into the processing chamber 4 and the supplying of the plasma generation high-frequency power into the processing chamber 4 can be performed at the same timing. As illustrated in a graph G2 and a graph G3 in FIG. 4, in step S3, at time T2, both the supplying of the second gas into the processing chamber 4 and the supplying of the plasma generation high-frequency power into the processing chamber 4 are started at the same timing (the supplying of the second gas and the supplying of the plasma generation high-frequency power are switched from OFF to ON at the same timing). The graph G2 illustrates the start timing and the end timing of the supplying of the second gas into the processing chamber 4 in the method MT. The graph G3 illustrates the start timing and the end timing of the supplying of the plasma generation high-frequency power into the processing chamber 4 in the method MT. Time T2 is the time after time T1 and before time T4. The supplying of the second gas into the processing chamber 4 is continued until time T4. The supplying of the plasma generation high-frequency power into the processing chamber 4 is continued until the time T3. Time T3 is the time after time T2 and before time T4.

Through the processing of step S3, as illustrated in the part (b) of FIG. 3, the insulating film 63 is formed only on the surface 62a of the insulating portion 62 and is not formed on the surface 61a of the metal portion 61. In this manner, in step S3, the insulating film 63 is selectively formed on the insulating portion 62 on the main surface 6 of the wafer W. In a case where an element of the etching species contained in the plasma generated in step S3 is halogen (X), the insulating film 63 contains the halogen (X) and can be, for example, a SiO:X film. In particular, in a case where an element of the etching species is fluorine, the insulating film 63 is a SiO:F film.

Following step S3, in step S4 (fourth step), generation of the plasma in the processing chamber 4 started in step S3 is terminated. In step S4, after terminating the supplying of the plasma generation high-frequency power into the processing chamber 4, the supplying of the first gas into the processing chamber 4 and the supplying of the second gas into the processing chamber 4 are terminated at the same timing. As illustrated in the graphs G1 to G3 in FIG. 4, in step S4, after the supplying of the plasma generation high-frequency power into the processing chamber 4 is terminated at time T3 (the supplying of the plasma generation high-frequency power is maintained to be OFF), at time T4, both the supplying of the first gas into the processing chamber 4 and the supplying of the second gas into the processing chamber 4 are terminated at the same timing (the supplying of the first gas and the supplying of the second gas are switched to OFF at the same timing and maintained to be OFF).

According to the method MT of the embodiment described above, at least the following effects can be obtained as an example. As a result of earnest research, first, the inventors have found that, a phenomenon in which, in a case where the plasma generated in step S3 contains not only the deposition species but also a relatively large number of etching species, the etching effect by the etching species on the surface 61a of the metal portion 61 becomes greater than the etching effect on the surface 62a of the insulating portion 62, and accordingly, the deposition of the insulating film 63 by the deposition species proceeds on the surface 62a of the insulating portion 62, but the deposition of the film is suppressed due to the etching effect caused by the etching species on the surface 61a of the metal portion 61, occurs. The phenomenon is thought to be caused by the fact that a difference between the incubation time of the surface 62a of the insulating portion 62 and the incubation time of the surface 61a of the metal portion 61 is expanded by the etching species. In other words, in a case where the incubation is long (in the present embodiment, the surface of the metal portion), since the nucleation at the initial stage of film growth on the surface is slow, the nucleus annihilation rate by etching becomes higher than the nucleation rate and the growth of the film is suppressed. Meanwhile, in a case where the incubation time is short (in the present embodiment, the surface of the insulating portion), since the nucleation at the initial stage of film growth on the surface is fast, the nucleus annihilation rate by etching becomes lower than the nucleation rate and the growth of the film is promoted. Therefore, by adjusting the proportion between the deposition species and the etching species in the plasma (for example, by adjusting the type of gas generating the plasma), without making the processing complicated, it is possible to form the insulating film 63 selectively only on the surface 62a of the insulating portion 62 on the main surface 6 of the wafer W on which both the surface 61a of the metal portion 61 and the surface 62a of the insulating portion 62 are exposed.

In addition, in the technology of the related art, (1) there is provided a method for activating an insulating film part by locally heating or the like a film formation part which is a bottom portion of a trench groove between metal wirings by infrared light (Japanese Unexamined Patent Publication No. H02-9126) or ultraviolet light (Japanese Unexamined Patent Publication No. 2002-359241), and for selectively forming an insulating film at the part, or (2) there is provided a method for adsorbing halogen or the like on the metal wiring by supplying the halogen gas or the like before the insulating film formation, and then for selectively growing the insulating film on the bottom portion of the trench groove other than the metal part (Japanese Unexamined Patent Publication No. H07-226437). However, in any of the technologies described in the above-described (1) and (2), it is necessary to employ complicated two-step processing of forming the insulating film after performing processing of obtaining selectivity before forming the insulating film, but on the other hand, in the method MT according to the embodiment, it is not necessary to employ the complicated two-step processing and only one-step processing may be executed, and thus, productivity, such as throughput, is improved. Further, in the method MT according to the embodiment, the insulating film is not formed so as to be embedded in a narrow space between the wirings or projections, but with respect to the main surface 6 of the wafer W, only from the surface 62a of the insulating portion 62, it is possible to grow the insulating film 63 above the surface 61a of the metal portion 61 except for the surface 61a of the metal portion 61, and to form a trench or a hole of the insulating film, and thus, it is possible to achieve a substantial reduction in number of steps of forming the wiring. Furthermore, in the method MT according to the embodiment, not the selective growth of the insulating film simply caused by the difference of the ground, but the selective growth of the insulating film 63 is possible on the insulating portion 62 other than the surface 61*a* (metal surface) of the metal portion 61 having the properties that the electronic transfer is relatively easily performed, by using the deposition species and the etching species generated by the plasma and adjusting the proportion of the species.

Silicon is used as an element of the deposition species, halogen is used as an element of the etching species, and accordingly, it is possible to selectively form the insulating film 63 only on the surface 62*a* of the insulating portion 62 on the main surface 6 of the wafer W. In particular, even when fluorine is also used as an element of the etching species, it becomes possible to selectively form the insulating film 63 only on the surface 62*a* of the insulating portion 62 on the main surface 6 of the wafer W. In addition, as the second gas contains silicon and halogen (for example, fluorine), the plasma generated in step S3 can contain the deposition species and the etching species. Further, even in a case where the material of the metal portion 61 is copper, it is possible to selectively form the insulating film 63 only on the surface 62*a* of the insulating portion 62.

In addition, in step S3, the supplying of the second gas and the supplying of the plasma generation high-frequency power are performed at the same timing, and accordingly, since deposition by the deposition species and etching by the etching species are appropriately implemented with an excellent balance, the selective formation of the insulating film 63 is more appropriately realized. In addition, in step S4, since the supplying of the second gas or the like is terminated after the supplying of the plasma generation high-frequency power is terminated and the generation of the plasma is completed, even in a case where the deposition of the film by the plasma is excessively performed, until the supplying of the second gas is terminated after the deposition of the film by the plasma is terminated, the excessive deposition can be removed as the etching is continued by the halogen contained in the second gas. In addition, it is preferable that the supplying of the second gas and the supplying of the plasma generation high-frequency power are performed at the same timing, but there can be a case where a time lag in an increase in concentration of the second gas in the processing chamber 4 occurs, and thus, in this case, the supplying of high-frequency power may gradually increase. By doing so, the deposition by the deposition species and the etching by the etching species can be performed with an excellent balance.

In addition, in a case where the precoat film PC that contains silicon and halogen is formed in advance on the surface on the inner side of the processing chamber 4 where the insulating film 63 is formed before the formation of the insulating film 63 on the main surface 6 of the wafer W is started in step S1, with respect to the selective formation of the insulating film 63 on the surface 6 of the wafer W, more effective plasma can be formed not only by the second gas that contains the silicon and halogen but also by the second gas and each atom of silicon and halogen separated from the precoat film PC.

Example 1

Steps S2 and S3 can be implemented under the following condition, for example. In addition, the following condition is a condition in a case where the precoat film PC is not formed on the surface on the inner side of the processing chamber 4.

Value [Pa] of pressure in processing chamber 4: 0.1 to 10 [Pa]

Value [MHz] of frequency of high-frequency power source 15 and value [watt] of high-frequency power: 13.56 [MHz], 100 to 5000 [watt]

Value [MHz] of frequency of high-frequency power source 29 and value [watt] of bias power: 0.4 to 6 [MHz], 0 to 500 [watt]

Processing gas: $O_2$ gas (first gas), $SiF_4$ gas (second gas)

Example 2

There is a case where the precoat film PC that contains silicon and halogen is formed on the surface on the inner side of the processing chamber 4 used in step S1. The film thickness of the precoat film PC is approximately 100 [nm] or less. In addition, the precoat film PC is foamed almost entirely on the inside of the processing chamber 4.

Example 3

Figure 6:
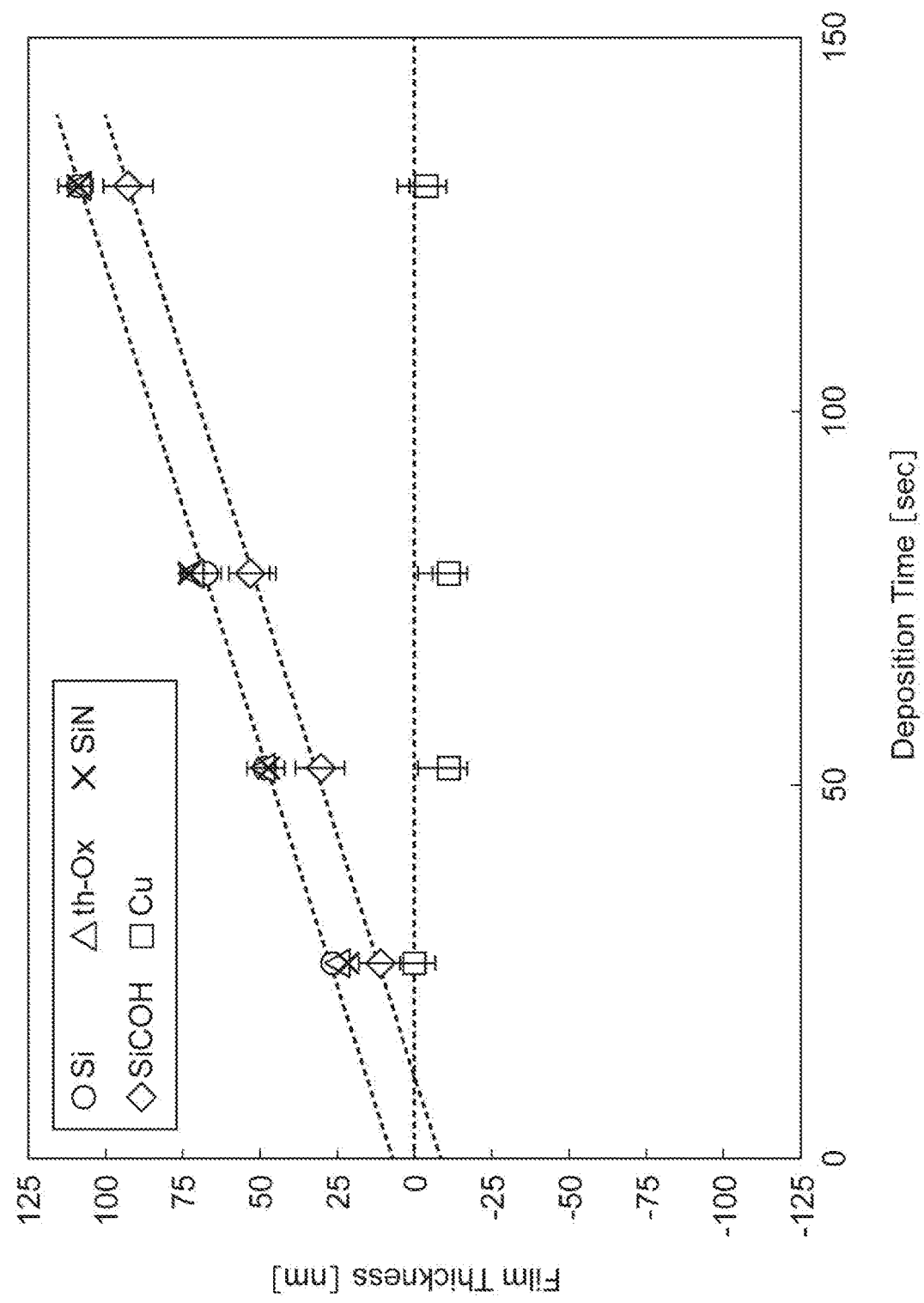
FIG. 6 is a view illustrating the result of examples obtained for each material of an underlayer.
Figure 7:
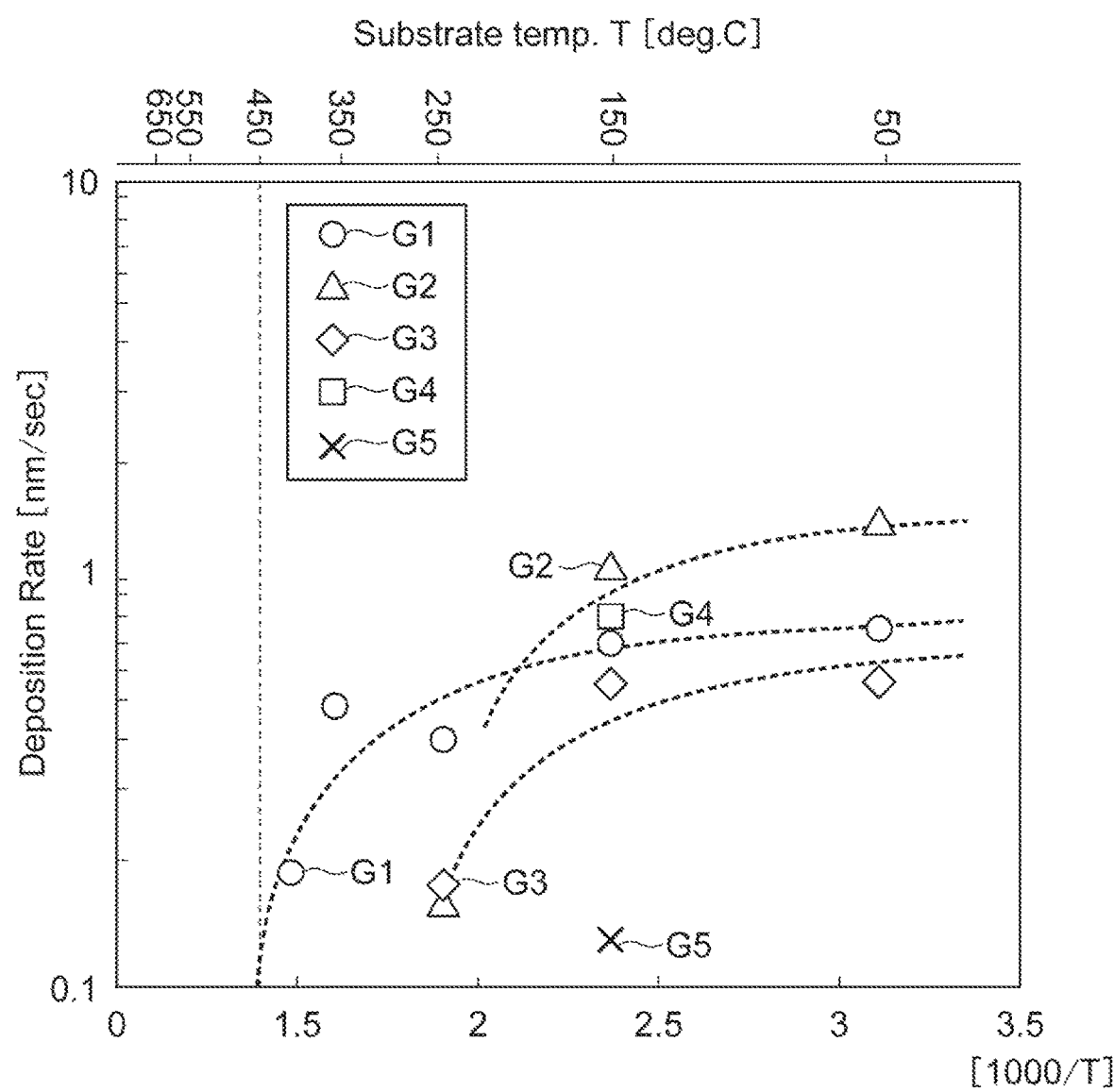
FIG. 7 is a view illustrating the result obtained under various process conditions.

Steps S2 to S4 were executed by using the following process condition A using each of Si, th-Ox (thermal oxide film), SiN, SiCOH, and Cu as the materials of the underlayer, and the results illustrated in FIGS. 6 and 7 were obtained. FIG. 6 is a view illustrating the result of examples obtained for each material of the underlayer. The horizontal axis of FIG. 6 represents the execution time [sec] of step S3, and the vertical axis of FIG. 6 represents the thickness (film thickness) [nm] of the laminated film. FIG. 7 is a view illustrating the result obtained under various process conditions. The horizontal axis on the upper side of FIG. 7 represents the temperature [° C.] (T[° C.]) of the wafer W (underlayer) at the time of execution of step S3, the horizontal axis on the lower side of FIG. 7 represents the value (1000/T) obtained by multiplying the inverse number of T[° C.] by 1000, and the vertical axis in FIG. 7 represents the deposition rate [nm/sec] of the film.

Process Condition A

Value [Pa] of pressure in processing chamber 4: 1.33 [Pa]

Value [MHz] of frequency of high-frequency power source 15 and value [watt] of high-frequency power: 13.56 [MHz], 2000 [watt]

Value [MHz] of frequency of high-frequency power source 29 and value [watt] of bias power: 2 [MHz] (variable within range of 4 to 6 [MHz]), 0 [watt] (variable within range of 0 to 600 [watt])

Processing gas: $O_2$ gas (first gas), $SiF_4$ gas (second gas)

Gas flow rate [sccm]: ($O_2$ gas) 200 [sccm], ($SiF_4$ gas) 7.5 [sccm]

All the results illustrated in FIG. 6 are the results that can be obtained under the condition that the temperature of the wafer W (underlayer) at the time of execution of step S3 is 50 [° C.] together with the process condition A. A result G1 illustrated in FIG. 7 is a result that can be obtained under the process condition A while changing the temperature (T [° C.]) of the wafer W (underlayer) in step S3. A result G2 illustrated in FIG. 7 is a result that can be obtained under the condition that the gas flow rate [sccm] satisfies Gas flow rate [sccm]: ($O_2$ gas) 100 [sccm], ($SiF_4$ gas) 7.5 [sccm], among the process conditions A while changing the temperature (T [° C.]) of the wafer W (underlayer) in step S3. A result G3 illustrated in FIG. 7 is a result that can be obtained under the process condition that the value [Pa] of the pressure in the processing chamber 4 satisfies Value [Pa] of pressure in processing chamber 4: 13 [Pa], among the process conditions A while changing the temperature (T [° C.]) of the wafer W (underlayer) in step S3.

A result G4 illustrated in FIG. 7 is a result that can be obtained under the process condition that the value [Pa] of the pressure in the processing chamber 4 satisfies Value [Pa] of pressure in processing chamber 4: 1.7 [Pa], among the process conditions A while changing the temperature (T [° C.]) of the wafer W (underlayer) in step S3. A result G5 illustrated in FIG. 7 is a result that can be obtained under the process condition that the value [MHz] of the frequency of the high-frequency power source 29 and the value [watt] of the bias power satisfy Value [MHz] of frequency of high-frequency power source 29 and value [watt] of bias power: 2 [MHz] (variable within range of 4 to 6 [MHz]), 0 [watt] (variable within range of 0 to 600 [watt])

among the process conditions A while changing the temperature (T [° C.]) of the wafer W (underlayer) in step S3. The results G1 to G5 illustrated in FIG. 7 were obtained in the same way regardless of whether the material of the underlayer is Si, th-Ox (thermal oxide film), SiN, or SiCOH.

As illustrated in FIGS. 6 and 7, as a result of earnest research, the inventors have found that, in a case where the temperature of the wafer W (underlayer) is within the range of 50 degrees Celsius to 450 degrees Celsius in step S3, the lamination of the film on the surface of the underlayer of the metal material (Cu) is suppressed, and the lamination of the film on the surface of the underlayer of the insulating material (Si, th-Ox (thermal oxide film), SiN, and SiCOH) is promoted.

As illustrated in FIG. 6, in a case where the material of the underlayer is an insulating material (Si, th-Ox (thermal oxide film), SiN, and SiCOH), in accordance with an increase in execution time of step S3, the film thickness to be formed on the underlayer also increases. Meanwhile, in a case where the material of the underlayer is a metal material (Cu), almost no film is formed on the underlayer regardless of the execution time of step S3.

In addition, as illustrated in FIG. 7, regardless of whether the material of the underlayer is an insulating material (Si, th-Ox (thermal oxide film), SiN, and SiCOH), in a case where the temperature of the wafer W (underlayer) in step S3 is equal to or lower than 450 degrees Celsius and is further equal to or higher than approximately room temperature (more specifically, 50 degrees Celsius) (that is, in a case of being within the range of 50 degrees Celsius to 450 degrees Celsius), even when the respective elements included in the process condition, that is, the pressure in the processing chamber 4, the gas flow rate, the bias power of the high-frequency power source 29, and the like, have various values, the deposition rate [nm/sec] of the film formed on the underlayer becomes a sufficiently large value. According to the results G1 to G5 illustrated in FIG. 7, it is appropriate that the temperature of the wafer W in step S3 is within the range of 50 degrees Celsius to 450 degrees Celsius in a case of performing the film formation on the underlayer of the insulating material, such as Si, th-Ox (thermal oxide film), SiN, SiCOH, or the like.

The principle of the present invention has been illustrated and described above in the preferable embodiments, but it is recognized by a person skilled in the art that the present invention can be modified in arrangements and details without deviating from such a principle. The present invention is not limited to the specific configuration disclosed in the present embodiment. Accordingly, a right to make all amendments and changes that come from the scope of the claim and the scope of spirit is claimed.

In step S3, the supplying of the second gas into the processing chamber 4 and the supplying of the plasma generation high-frequency power into the processing chamber 4 are performed at time T2, but at time T2, the timing of the supplying of the second gas into the processing chamber 4 may be before the timing of the supplying of the plasma generation high-frequency power into the processing chamber 4 to the extent that the plasma state in the processing chamber 4 does not become unstable.

REFERENCE SIGNS LIST

1 . . . PROCESSING CONTAINER; 10 . . . PLASMA PROCESSING APPARATUS; 11 . . . SHOWER HOUSING; 12 . . . GAS FLOW PATH; 12a . . . GAS SUPPLY HOLE; 13 . . . HIGH-FREQUENCY ANTENNA; 13a . . . SPACER; 14 . . . MATCHING UNIT; 15 . . . HIGH-FREQUENCY POWER SOURCE; 16 . . . POWER SUPPLY MEMBER; 18 . . . CAPACITOR; 1a . . . GROUND WIRE; 2 . . . DIELECTRIC WALL; 20 . . . PROCESSING GAS SUPPLY SYSTEM; 20a . . . GAS SUPPLY PIPE; 22 . . . SUSCEPTOR; 24 . . . INSULATING FRAME; 25 . . . SUPPORT; 25a . . . POWER SUPPLY ROD; 26 . . . BELLOWS; 27 . . . GATE VALVE; 27a . . . CARRYING IN-OUT PORT; 28 . . . MATCHING UNIT; 29 . . . HIGH-FREQUENCY POWER SOURCE; 3 . . . ANTENNA CHAMBER; 30 . . . EXHAUST DEVICE; 31 . . . EXHAUST PIPE; 3a . . . SIDE WALL; 4 . . . PROCESSING CHAMBER; 41 . . . POWER SUPPLY UNIT; 43 . . . POWER SUPPLY UNIT; 4a . . . SIDE WALL; 5 . . . SUPPORTING SHELF; 6 . . . MAIN SURFACE; 61 . . . METAL PORTION; 61a . . . SURFACE; 61b . . . RECESS; 62 . . . INSULATING PORTION; 62a . . . SURFACE; 63 . . . INSULATING FILM; Cnt . . . CONTROL UNIT; MT . . . METHOD; PC . . . PRECOAT FILM; W . . . WAFER.

The invention claimed is:

1. A method for processing a workpiece, the workpiece including a metal portion, an insulating portion, and a main surface, in which a first surface of the metal portion and a second surface of the insulating portion are exposed on the main surface side, the method comprising:
   a first step of accommodating the workpiece in a processing chamber of a plasma processing apparatus;
   a second step of starting supplying a first gas into the processing chamber after the first step; and
   a third step of starting processing of generating a plasma in the processing chamber caused by a gas in the processing chamber containing a second gas by supplying the second gas and plasma generation high-frequency power into the processing chamber after the second step, wherein
   the first gas contains oxygen,
   the plasma generated in the third step contains deposition species and etching species,
   an insulating film is selectively formed only on the second surface of the insulating portion, and
   in the plasma generated in the third step, a proportion occupied by the etching species is greater than a proportion occupied by the deposition species.

2. The method according to claim 1, wherein
   an element of the deposition species is silicon and an element of the etching species is halogen.

3. The method according to claim 1, wherein
an element of the etching species is fluorine.
4. The method according to claim 1, wherein
the second gas contains silicon and halogen.
5. The method according to claim 1, wherein
the metal portion contains copper.
6. The method according to claim 1, wherein,
in the third step, supplying of the second gas into the processing chamber and supplying of the plasma generation high-frequency power into the processing chamber are performed at the same timing.
7. The method according to claim 6, further comprising:
a fourth step of terminating plasma generation after the third step, wherein,
in the fourth step, after terminating the supplying of the plasma generation high-frequency power into the processing chamber, supplying of the first gas into the processing chamber and the supplying of the second gas into the processing chamber are terminated at the same timing.
8. The method according to claim 1, wherein,
in the first step, the surface on an inner side of the processing chamber has a part covered with a precoat film that contains silicon and halogen.
9. The method according to claim 1, wherein,
in the third step, a temperature of the workpiece is within a range of 50 degrees Celsius to 450 degrees Celsius.
10. An apparatus for processing a workpiece comprising:
a processing chamber provided to accommodate the workpiece;
a processing gas supply system provided to supply a first gas and a second gas into the processing chamber, wherein the first gas contains oxygen;
a high-frequency power source provided to supply a plasma generation high-frequency power into the processing chamber; and
a controller including a processor, wherein
the workpiece includes a metal portion, an insulating portion, and a main surface, in which a first surface of the metal portion and a second surface of the insulating portion are exposed on the main surface side,
the processor controls the processing gas supply system and the high-frequency power source to execute:
   a first step of accommodating the workpiece in the processing chamber;
   a second step of starting supplying the first gas into the processing chamber after the first step; and
   a third step of starting processing of generating a plasma in the processing chamber caused by a gas in the processing chamber containing the second gas by supplying the second gas and plasma generation high-frequency power into the processing chamber after the second step,
the plasma generated in the third step contains deposition species and etching species,
an insulating film is selectively formed only on the second surface of the insulating portion, and
a proportion occupied by the etching species is greater than a proportion occupied by the deposition species, in the plasma generated in the third step.
11. The apparatus according to claim 10, wherein
an element of the deposition species is silicon and an element of the etching species is halogen.
12. The apparatus according to claim 10, wherein
an element of the etching species is fluorine.
13. The apparatus according to claim 10, wherein
the second gas contains silicon and halogen.
14. The apparatus according to claim 10, wherein
the metal portion contains copper.
15. The apparatus according to claim 10, wherein,
in the third step, supplying of the second gas into the processing chamber and supplying of the plasma generation high-frequency power into the processing chamber are performed at the same timing.
16. The apparatus according to claim 15, wherein
the processor controls the processing gas supply system and the high-frequency power source to further execute a fourth step of terminating plasma generation after the third step, and
in the fourth step, after terminating the supplying of the plasma generation high-frequency power into the processing chamber, supplying of the first gas into the processing chamber and the supplying of the second gas into the processing chamber are terminated at the same timing.
17. The apparatus according to claim 10, wherein,
in the first step, the surface on an inner side of the processing chamber has a part covered with a precoat film that contains silicon and halogen.
18. The apparatus according to claim 10, wherein,
in the third step, a temperature of the workpiece is within a range of 50 degrees Celsius to 450 degrees Celsius.

* * * * *